United States Patent Office 3,152,025
Patented Oct. 6, 1964

3,152,025

METHOD OF MANUFACTURING ALLOY-DIFFUSION TRANSISTORS

Carl Heinrich Kramp, Hamburg-Niendorf, Germany, assignor to North American Philips Company, Inc., New York, N.Y., a corporation of Delaware No Drawing. Filed Feb. 6, 1961, Ser. No. 87,082
Claims priority, application Germany Mar. 11, 1960
3 Claims. (Cl. 148—179)

The invention relates to a method of manufacturing an alloy-diffusion transistor, on the semi-conductor body of which contacts are alloyed of a definite conductivity type and in which the conductivity of at least the parts of the surface layer adjacent to the contact is altered by incorporation of an active impurity by diffusion.

It is known to diffuse active impurities, such as antimony or arsenic, into semi-conductor bodies consisting of germanium or silicon and to obtain in this manner low resistance, n-conductive surface layers on semi-conductor bodies. For this purpose, in the manufacture of alloy-diffusion transistors, the impurities are added to the contact pellets to be alloyed. When alloying on the semi-conductor body, the atoms of the impurities diffuse into the semi-conductor body from the contact pellets. As a result of this, a n-conductive layer is formed in the diffusion zone in the p- or n-conductive semi-conductor body. In addition, when alloying, impurities will emerge from the pellets, which impurities precipitate on the whole crystal surface, diffuse into it, and form a n-conductive surface layer of low resistance. This desired surface layer forms a bridge between the base layer below the emitter layer of the one contact and the other contact which only serves as a connection for the base layer. However, this method has the drawback that the diffusion process on the crystal surface between the contacts is too weak and that consequently not every desired low-resistance, n-conductive surface layer can be formed.

It is also known to evaporate the impurities in high vacuum and precipitate them on the semi-conductor body. In the succeeding heating, the impurities diffuse into the semi-conductor crystal under a protective gas atmosphere. It is true that n-conductive surface layers of low resistance and sufficient thickness are obtained with this method, but the use of high vacuum is complicated and not suitable for mass production.

Since when alloying the contacts of alloy transistors the danger often exists that the contact material extends too far on the surface of the semi-conductor body, it was already proposed, to avoid this extension, first to alloy the contact pellets provided with impurities into the semi-conductor crystal at low temperature. Before the further treatment, the arrangement should be coated with a readily drying and hardening paste. In the succeeding heating at a temperature above the melting point of the contacts, the undesired extension of the contact material could then be prevented.

Such a paste is used according to the invention in a method of manufacturing an alloy-diffusion transistor, on the semi-conductor body of which contacts of a definite conductivity type are alloyed and in which the conductivity of at least the part of this surface layer adjacent to the contacts is converted by diffusion of an active impurity, while the contacts, after alloying them into the semi-conductor body, are coated with a paste which contains a sufficient quantity of an active impurity to be diffused into the surface of the body at a temperature below the melting point of the contacts, and the arrangement is subsequently heated at a temperature above the melting point of the contacts, the atoms of the impurity diffusing into the crystal.

Even n-conductive surface layers of low resistance and sufficient thickness are produced on semi-conductor bodies by means of this method according to the invention, since the hardening paste forms a reliable carrier for the impurities needed and which adheres well to the semi-conductor body and contacts.

Addition of the active impurities to the contact material itself is not strictly necessary, since the impurities also diffuse into the contacts during the diffusion process.

In another respect it is already known it is true to obtain a diffusion by containing the substances which are to be diffused into a body, in a bed for these bodies. According to a known method, silicon, which is contained in such a bed, is evaporated by heating and diffuses into the heating rods. In another known method, semi-conductor crystals are embedded in a powder for purposes of homogenising and activation, which powder consists of the same semi-conductive material. On heating, a material balance takes place between the semi-conductor body and the powder owing to diffusion.

These methods, in which the bodies are provided in a bed only loosely engaging the bodies, are not suitable for use in the manufacture of semi-conductive devices, such as alloy-diffusion transistors, since the diffusion does not occur sufficiently evenly. Particularly the production of even layers and even transition planes is decisive to obtain satisfactory electrical properties of semi-conductor devices.

The paste suitable for the method according to the invention may consist of an intimate mixture of pentavalent elements, such as antimony or arsenic, with magnesium oxide or aluminum oxide. The metal oxides solely serve as carriers for the antimony and arsenic and do not change during the whole manufacturing process.

The mixing ratios of the pentavalent elements with the metal oxides lie between 1:50 and 1:2000 in accordance with the desired low resistance of the n-conductive layer. The concentration of impurities in the rim zone is determined by the mixing ratio. From this rim zone on, the concentration of the diffused atoms decreases in accordance with an exponential function. The steepness of this concentration distribution curve within the crystal is adapted in known manner to the requirements by the choice of the diffusion temperature and diffusion time.

To dissolve the paste, any solvent may be used that, after providing the paste on the crystal, evaporates as quickly as possible.

The paste obtained by dissolving the mixture is coated, by painting, on the semi-conductor crystal consisting of germanium or silicon. However, the crystals may also be dipped in the paste.

If p-conductive semi-conductor material is used as the starting material, a n-conductive surface layer of a definite thickness is obtained after diffusion. The n-conductive layer of low resistance is limited there where the p-conductivity changes into a n-conductivity. This change in conductivity occurs there where the number of the pentavalent foreign atoms (which form the n-conductive layer) exceed the number of trivalent foreign atoms present in the crystal.

However, n-conductive semi-conductor material also may be used as the starting material. After diffusion of the pentavalent foreign atoms, a n-conductive surface layer of low resistance is obtained in this case also. A definite layer thickness cannot be indicated, since the distribution of the pentavalent foreign atoms in the crystal gradually decreases to a minimum value.

In order that the invention may be readily carried into effect, it will now be described in greater detail with reference to the folowing examples.

*Example 1*

Powdered Sb is mixed intimately with powdered $Al_2O_3$ in a ratio of 1:50. A paste is produced from this mixture by means of methanol. The paste is painted on the surface of a p-conductive germanium crystal, the resistance of which may be 4 ohm-cm., and is then dried. The mixture adheres as a layer to the germanium crystal and the contacts which were already alloyed into the crystal beforehand. The assembly is transferred to a furnace in which it is heated for 20 minutes at 750° C. under a protective gas, for example nitrogen. The Sb diffuses into the contact material and into the germanium crystal and forms a n-conductive surface layer of low resistance of 5$\mu$ thick in the crystal.

*Example 2*

Powdered As is mixed intimately with powdered MgO in a ratio of 1:250. From this mixture a paste is produced with butyl acetate. A n-conductive silicon crystal with alloyed contacts is dipped into this paste. Then the assembly is dried, the paste adhering as a layer. Then the crystal is transferred to a normal furnace in which it is heated for 5 minutes at 1000° C. under a protective gas. The As diffuses into the silicon crystal and forms a n-conductive surface layer of low resistance.

What is claimed is:

1. In a method of manufacturing an alloy-diffused transistor in which an electrode-forming mass is provided on the surface of a semiconductive body and is to be fused thereon to form an electrode connection to the body and the surrounding surface portions of the body are to have their conductivity altered, the steps of first fusing an electrode-forming mass to the semiconductive surface and then covering the fused electrode-forming mass and the surrounding body surface portions with a hardenable paste constituted principally of an inert refractory material whose melting point substantially exceeds that of the semiconductive body and containing a sufficient quantity of an active impurity selected from the group consisting of donors and acceptors so that when heated sufficient of the impurity will be freed from the paste and diffused into the surrounding body surface portions to cause the desired altered conductivity, thereafter drying the paste to harden same to form a mold on the body and enclosing the electrode-forming mass, heating said assembly at a temperature below the melting point of the body and refractory material and at which the electrode-forming mass melts within the confines of the enclosing mold and atoms thereof combine with the underlying body portion and at which active impurity is freed from the mold and contacts and diffuses into the surrounding body portions to form a surface of altered conductivity due to the presence therein of the active impurity, and cooling the assembly to solidify the melt and establish the desired electrode connection to the body over an area determined by the surrounding mold.

2. In a method of manufacturing an alloy-diffused transistor in which an electrode-forming mass is prealloyed on the surface of a semiconductive body and is to be refused thereon to form an electrode connection to the body and the surrounding surface portions of the body are to have their conductivity altered, the steps of covering the prealloyed electrode-forming mass and the surrounding body surface portions with a hardenable paste constituted of an inert refractory metal oxide and an active impurity selected from the group consisting of donors and acceptors in a weight ratio between 50:1 and 2000:1 so that when heated sufficient of the impurity will be freed from the paste and diffused into the surrounding body surface portions to cause the desired altered conductivity, thereafter drying the paste to harden same to form a mold on the body and enclosing the electrode-forming mass, heating said assembly at a temperature below the melting points of the body and metal oxide and at which the electrode-forming mass melts within the confines of the enclosing mold and atoms thereof combine with the underlying body portion and at which active impurity is freed from the mold and contacts and diffuses into the surrounding body portions to form a surface of altered conductivity due to the presence therein of the active impurity, and cooling the assembly to solidify the melt and establish the desired electrode connection to the body over an area determined by the surrounding mold.

3. A method as set forth in claim 2 wherein the impurity is selected from the group consisting of arsenic and antimony, the metal oxide is selected from the group consisting of magnesium oxide and aluminum oxide, and the impurity and the metal oxide are intimately mixed as powders.

References Cited in the file of this patent

UNITED STATES PATENTS

| | | |
|---|---|---|
| 2,794,846 | Fuller | June 4, 1957 |
| 2,823,149 | Robinson | Feb. 11, 1958 |
| 2,873,221 | Nijland et al. | Feb. 10, 1959 |
| 2,932,594 | Mueller | Apr. 12, 1960 |
| 2,974,072 | Genzer | Mar. 7, 1961 |
| 2,974,073 | Armstrong | Mar. 7, 1961 |
| 3,010,855 | Barson et al. | Nov. 28, 1961 |